(12) United States Patent
Vahidsafa et al.

(10) Patent No.: US 8,726,114 B1
(45) Date of Patent: May 13, 2014

(54) TESTING OF SRAMS (71) Applicant: Oracle International Corporation, Redwood Shores, CA (US)

(72) Inventors: Ali Vahidsafa, Palo Alto, CA (US); Sriram Anandakumar, Sunnyvale, CA (US); Gaurav Agarwal, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 35 days.

(21) Appl. No.: 13/672,799

(22) Filed: Nov. 9, 2012

(51) Int. Cl.
*G01R 31/28* (2006.01)

(52) U.S. Cl.
USPC .......................... 714/733; 714/718; 714/738

(58) Field of Classification Search
USPC ........... 708/250; 714/731, 738, 739, 733, 718
See application file for complete search history.

(56) References Cited

U.S. PATENT DOCUMENTS

| | | | |
|---|---|---|---|
| 4,847,800 A * | 7/1989 | Daane | 708/250 |
| 6,260,164 B1 | 7/2001 | Aipperspach et al. | |
| 6,351,837 B1 * | 2/2002 | Huang et al. | 714/733 |
| 6,563,751 B1 | 5/2003 | Wu | |
| 6,904,551 B1 | 6/2005 | Davidson | |
| 7,206,979 B1 * | 4/2007 | Zarrineh et al. | 714/718 |
| 7,437,626 B2 | 10/2008 | Chang et al. | |
| 7,437,636 B2 * | 10/2008 | Rajski et al. | 714/726 |
| 7,606,092 B2 | 10/2009 | Eby et al. | |
| 7,665,001 B2 | 2/2010 | Baik et al. | |
| 2007/0220391 A1 | 9/2007 | Han et al. | |
| 2013/0111286 A1 * | 5/2013 | Tekumalla | 714/726 |

FOREIGN PATENT DOCUMENTS

| | | |
|---|---|---|
| GB | 2313937 A | 12/1997 |
| GB | 2465036 A | 5/2010 |

OTHER PUBLICATIONS

Tehranipour et al.; An Efficient BIST Method for Testing of Embedded SRAMS; 0-7803-6685; 9/01; pp. V-73 thru V-76; Electrical and Computer Engineering Dept., University of Tehran, Tehran, IRAN, date: 2001.

Wang et al.; A Built-In Self-Test and Self-Diagnosis Scheme for Embedded SRAM; 1081-7735/00; 2000; pp. 45-50; Lab for Reliable Computing, Dept. of Electrical Engineering, National Tsing Hua University, Hsinchu, Taiwan / Faraday Technology Corp., Hsinchu, Taiwan, date: 2000.

* cited by examiner

*Primary Examiner* — David Ton
(74) *Attorney, Agent, or Firm* — Kraguljac Law Group, LLC (57) ABSTRACT

Systems, methods, and other embodiments associated with at-speed testing of static random access memory (SRAM) are described. In one embodiment, a method includes loading, into a multi-stage pipeline of memory devices, a control pattern for testing a static random access memory (SRAM). The SRAM is tested by generating a test input that is based, at least in part, on the control pattern from the multi-stage pipeline of flip-flops. The test input is provided to the SRAM over a series of clock cycles that are at a core clock speed of the SRAM.

20 Claims, 5 Drawing Sheets

TESTING OF SRAMS

BACKGROUND

Manufacturing integrated circuits is a difficult task. Often, the manufacturing process results in some integrated circuits that include defects. To insure that the integrated circuits are in proper working condition, testing of the integrated circuits occurs during the manufacturing process. One way the integrated circuits are tested is by applying a test input to each integrated circuit using a testing tool (e.g., an automated test equipment). The testing tool applies, for example, a single input to an integrated circuit, issues a clock signal, and then loads another input before continuing.

However, testing in this way is not at an operating clock speed (i.e., at-speed) of the integrated circuit because only the single input is applied before testing is paused to load a next value. While a testing tool that uses a single input and then must reload can detect certain types of defects on some integrated circuits, it is not a comprehensive method of testing. This is especially apparent with complex integrated circuits such as static random access memory (SRAM) that are embedded inside, for example, a high end processor that operates at a very high frequency. A complex configuration of SRAM circuits is difficult to test with a testing tool that operates at slow testing speeds. Additionally, multiple cycle inputs for testing SRAM are not easy to back-compute by test generation tools. Accordingly, many difficulties arise when testing complex SRAM integrated circuits.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems, methods, and other embodiments are described that are associated with at-speed testing of static random access memory (SRAM). Consider that testing the SRAM is a complex task. An internal structure of the SRAM does not reveal defects when only a single test input is applied using, for example, a testing tool separate from the SRAM. When applying only a single input, internal states of the SRAM are not varied or changed at-speed, but are instead tested with periods of intermediate loading of additional test inputs that delays testing. That is, the internal states of the SRAM are not varied at an operational speed (at-speed) of a core clock of the SRAM because the testing tool operates at its speed, which is a slower speed. Thus, the internal structures are not effectively tested because they are not sequentially tested at-speed. However, a multiple cycle test input that reveals defects is also difficult to compute and apply at the core clock speed of the SRAM using testing tools.

Accordingly, in one embodiment, the SRAM is configured with a multi-stage pipeline of flip-flops that permits testing at a core clock speed of the SRAM. The multi-stage pipeline permits testing by providing a series of test inputs to change internal states of the SRAM as though the SRAM were receiving inputs under normal operation conditions (e.g., at the core clock speed). That is, the series of test inputs are provided at an operational clock speed of the SRAM.

To achieve testing in this way, the multi-stage pipeline stores a control sequence that generates a computed test input that is devised to effectively test the SRAM. The test input toggles inputs to the SRAM over a series of clock-cycles that occur at the operational clock speed of the SRAM and using the multi-stage pipeline that is designed for testing the SRAM. In this way, the multi-stage pipeline tests the SRAM at-speed by changing an internal state of the SRAM to test internal components.

Figure 1:
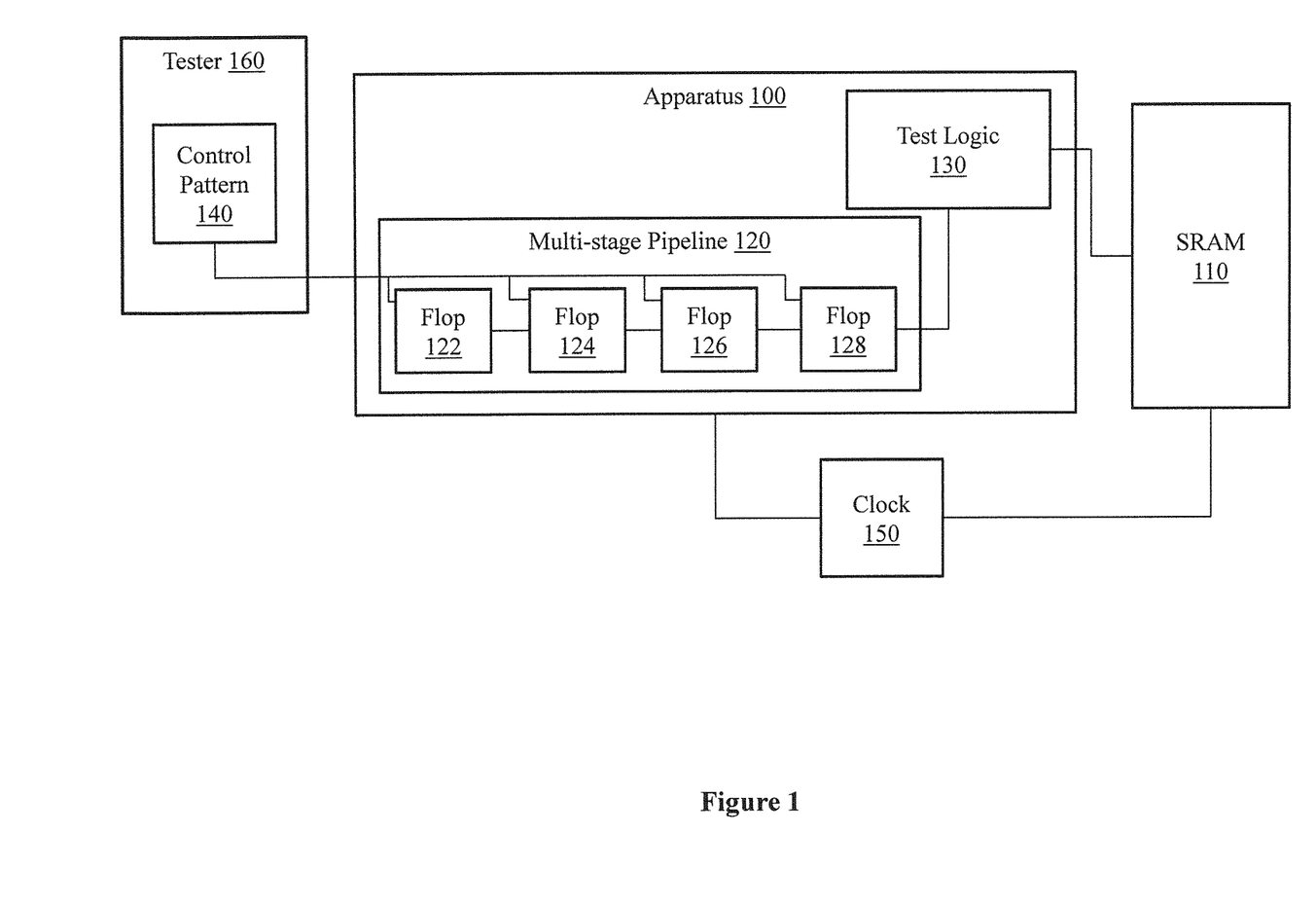
FIG. 1 illustrates one embodiment of an apparatus associated with testing of an SRAM.

With reference to FIG. 1, one embodiment of an apparatus 100 associated with testing a static random access memory (SRAM) 110 at a core clock speed of the SRAM 110 is illustrated. The apparatus 100 can be integrated with the SRAM 110 or can be a separate integrated circuit that is connected to the SRAM 110. Additionally, the apparatus 100 and the SRAM 110 can be, for example, embedded within a processor. The apparatus 100 includes a multi-stage pipeline 120 with flip-flops 122-128. The apparatus 100 also includes a test logic 130 that is connected to the SRAM 110. In one embodiment, the apparatus 100 is an input collar or built-in self-tester that is designed for testing and controlling the input of test signals into the SRAM 110.

In addition to the apparatus 100 and the SRAM 110, FIG. 1 also illustrates a control pattern 140 and a clock 150. The control pattern 140 is, for example, a series of control signals that are loaded into the multi-stage pipeline 120 (e.g., one signal into each flip-flop) prior to testing the SRAM 110. The series of control signals in the control pattern 140 are successively released by the multi-stage pipeline 120 over a series of clock cycles to control the test logic 130. In one embodiment, the control pattern 140 is stored in a memory or storage device. In one embodiment, the control pattern 140 is loaded into the pipeline 120 by a tester 160. Accordingly, the SRAM 110 and the apparatus 100 are a unit under test. Furthermore, the apparatus 100 may be a design for test (DFT) circuit of the SRAM 110 that uses scan input lines to receive the control pattern 140 from the tester 160.

The multi-stage pipeline 120 uses the clock 150 to dynamically control the timing of when test input signals are generated by the test logic 130. The clock 150 is, for example, a clock generator or other timing signal generator that generates a clock signal for synchronously controlling an integrated circuit (e.g., SRAM 110, apparatus 100). The clock signal occurs at a clock rate or frequency (e.g., clock speed) at which the SRAM 110 operates when integrated in a computing system. The clock rate/speed of the clock 150 is an operational speed (e.g., core clock speed) of the SRAM 110 at which the SRAM 110 reads and writes data from and to memory cells in the SRAM 110. The clock 150 is illustrated as being separate from the apparatus 100 and the SRAM 110, however, the clock 150 may be integrated with the apparatus 100, the SRAM 110, both the SRAM 110 and the apparatus 100, or with a host computing system. In either case, the clock 150 generates clock signals that control the SRAM 110 at a core clock speed.

In one embodiment, the series of control signals in the control pattern 140 are provided at the core clock speed of the SRAM 110 to the test logic 130. In this way, the clock 150 is used by the apparatus 100 to dynamically generate and provide test input signals to the SRAM 110 at the core clock speed of the SRAM 110 based on the signals received from the multi-stage pipeline 120. Accordingly, the apparatus 100 does not use a predefined stored test input to test the SRAM 110, but rather allows patterns stored on the tester 160 to be loaded into the pipeline 120, and then the apparatus 100 dynamically generates the test input signals at the core clock speed (e.g., at speed) of the SRAM 110 as the series of control signals from the control pattern 140 control the test logic 130.

The control pattern 140 is loaded into the pipeline 120 using, for example, existing scan infrastructure. The series of control signals that make up the control pattern 140 are provided by the pipeline 120 to the test logic 130 one at a time over several clock cycles to generate the test inputs in various ways. For example, consider that effectively testing the SRAM 110 includes providing a sequence of test inputs with different values. Providing the test inputs causes the SRAM 110 to change internal states of memory cells and also to read values from memory cells, thereby testing whether the memory cells are working properly.

However, to provide the test inputs in this way, each control signal in the control pattern 140 is pre-determined and arranged in a specific order in the control pattern 140 to insure that the test input provided to the SRAM 110 includes a particular sequence of signals that cause a desired change within the SRAM 110 on a particular clock cycle. This complex timing and arrangement of signals is used to effectively test the SRAM 110.

Accordingly, by using the multi-stage pipeline 120 to provide a control signal to the test logic 130 at each cycle of the clock 150, the test logic 130 is controlled to provide a sequence of test inputs to the SRAM 110 at the core clock speed (e.g., at-speed) of the SRAM 110. Thus, the series of control signals are configured to control how test input signals are generated. In one embodiment, when testing the SRAM 110, the clock 150 is not changed or slowed to a "testing speed," rather the clock 150 is the speed at which the SRAM 110 typically operates when connected and operating in a computing system.

For example, consider that to load the control pattern 140 into the pipeline 120, the clock 150 is disabled. Once the clock 150 is disabled, the tester 160 loads the control pattern 140 into flip-flops 122-128 of the pipeline 120 using existing scan infrastructure of the SRAM 110. Accordingly, the flip-flops 122-128 function as storage devices to store the control pattern 140. After the control pattern 140 is loaded into the pipeline 120, the clock 150 is enabled and the SRAM 110 is tested. In this manner, the control pattern 140, which includes multiple control signals, is applied to the SRAM 110 at a speed of the clock 150 in order to test the SRAM 110 at-speed. Accordingly, a sequence of control signals in the control pattern can be applied to the SRAM 110 at a core clock speed of the SRAM 110.

To provide the series of control signals at a correct time, the multi-stage pipeline 120 is configured with a series of flip-flops 122-128. The flip-flops 122-128 are integrated circuits that can maintain two stable states to store state information. The flip-flops 122-128 remember a programmed value (e.g., "1" or "0") until provided with a new value.

In one embodiment, the flip-flops 122-128 are, for example, D type flip-flops, JK flip-flops, SR flip-flops, or other memory device to store a sequence of values. The control pattern 140 is loaded into the flip-flops 122-128 prior to beginning a test. A testing tool (e.g., a computer controlled hardware component) loads the control pattern into the flip-flops 122-128 using, for example, control inputs (shown as lines from the control pattern 140 to the flip-flops 122-128 in FIG. 1). Alternatively, the control pattern may be manually loaded into the flip-flops 122-128.

In one embodiment, the flip-flops 122-128 are arranged in a series with an output of a previous flip-flop as an input to a next flip-flop. When arranged in a series, signals stored in the flip-flops 122-128 successively propagate to the test logic 130 over the series of clock cycles. For example, initially, the flip-flop 128 stores a value provided on a first clock cycle while the flip-flop 126 stores a value in the control pattern provided on a second clock cycle and so on. Values stored in the flip-flops 122-128 successively propagate through the flip-flops 122-128 of the pipeline 120 on each clock cycle of the clock 150 in order to provide a next value in the control pattern to the test logic 130 at the core clock speed of the SRAM 110. By providing control signals in this way, the test signals are linked to a clock rate at which the clock cycles of the clock 150 occur. This clock rate is an operational speed of the SRAM 110. Therefore, the SRAM 110 is tested at the operational speed of the SRAM 110 (e.g., at-speed) and not at a reduced speed of the tester 160.

As an example, consider that a control pattern 140 loaded into the pipeline 120 by the tester 160 is "0101." Accordingly, after the control pattern 140 is loaded into the pipeline 120, the flip flop 122 has a value "0," the flip-flop 124 has a value of "1," the flip-flop 126 has a value of "0," and the flip-flop 128 has a value of "1." Consequently, on a first clock cycle in the series of clock cycles, the flip-flop 128 has a value of "1" that is provided to the test logic 130. An input of the flip-flop 128 is the current value of the flip-flop 126, which is "0." After the first clock cycle, the value of the flip-flop 128 becomes a next value (e.g., "0") in the control pattern 140 that is provided to the flip-flop 128 by the flip-flop 126. Thus, on a next clock cycle in the series of clock cycles, the value of the flip-flop 128 is "0."

The flip-flop 128 provides the value "0" to the test logic 130 on the next clock cycle. In this way, the control pattern "0101" propagates through the pipeline 120 over the series of clock cycles to control the test logic 130 to provide a test input (e.g., on a connection between the SRAM 110 and the test logic 130) to the SRAM 110. By providing the test inputs to the SRAM 110 an internal state of memory cells in the SRAM 110 is changed over the series of clock cycles and a result can then be scanned out using existing scan infrastructure of the SRAM 110 to compare with an expected result.

Figure 2:
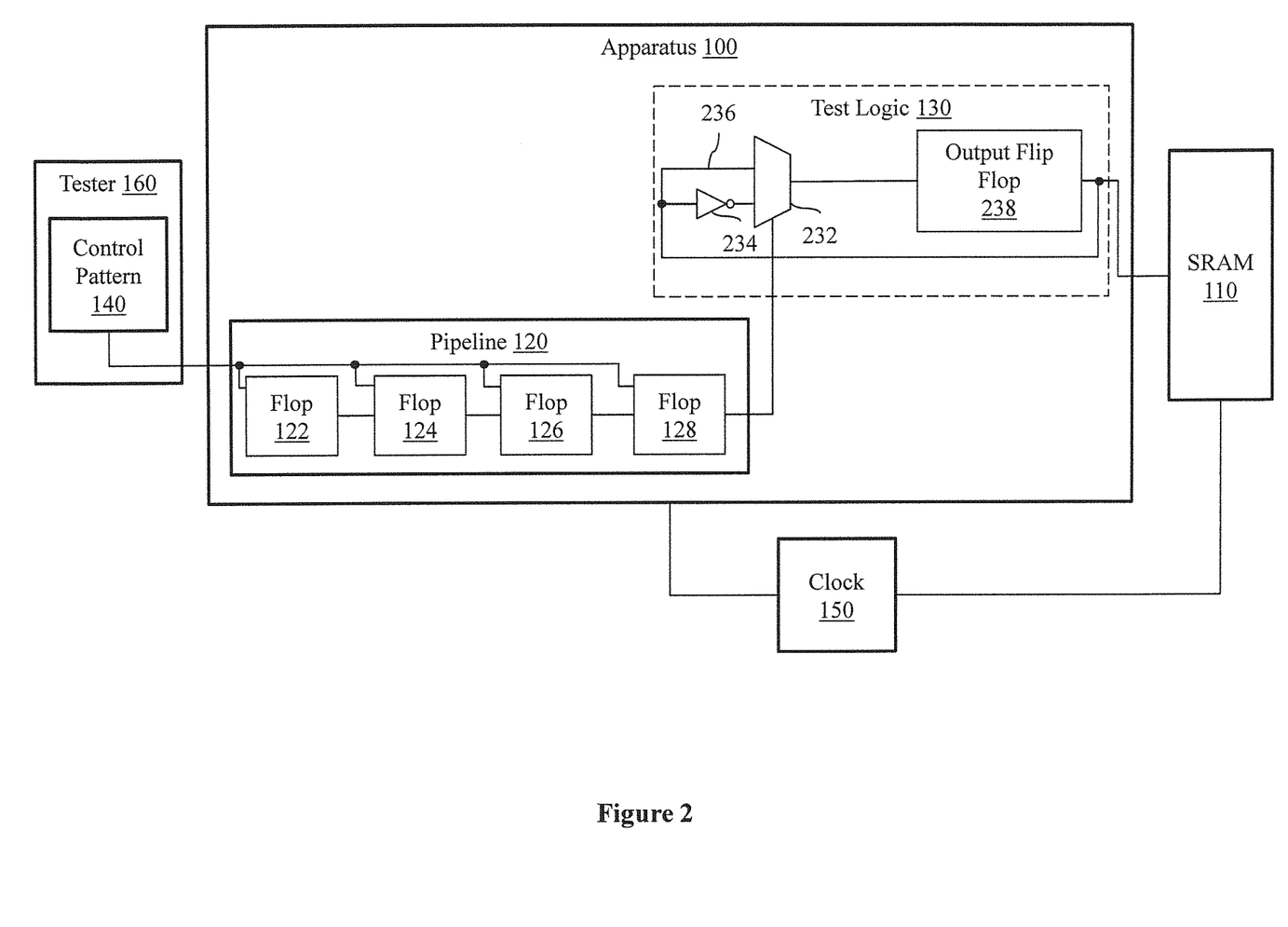
FIG. 2 illustrates another embodiment of an apparatus associated with testing of an SRAM.

Further aspects of testing an SRAM at a core clock speed of the SRAM will be discussed with reference to FIG. 2. FIG. 2 illustrates another embodiment of the apparatus 100 shown in FIG. 1. In FIG. 2, the test logic 130 also includes a multiplexer (mux) 232, an inverted input 234 from a feedback signal to the mux 232, and a regular input 236 (e.g., true) of the feedback signal. The test logic 230 also includes an output flip-flop 238 that is configured to hold a current value provided by the mux 232 to an input of the SRAM 110.

In one embodiment, an output of the flip-flop 238 is connected in a feedback loop to provide the inverted input 234 and the regular input 236 to the mux 232. Accordingly, the mux 232 provides either the regular input 236 or the inverted input 234 of the feedback signal to the SRAM 110. Whether the regular input 236 or the inverted input 234 is selected is a function of a current control signal from the pipeline 120. In FIG. 2, an output of the pipeline 120, which is an output of the flip-flop 128, is provided on a control input of the mux 232. The output of the flip-flop 128 is a current value in the control pattern 140 stored in the pipeline 120. Accordingly, the current value in the control pattern controls the mux 232 to select between the inverted input 234 and the regular input 236 as the output of the mux 232. In this way, the apparatus 100 generates a test input from the control pattern 140 by controlling the test logic 230 to toggle between a value that is recirculated from the output of the test logic 130.

In FIG. 2, the test logic 130 is illustrated with a feedback loop from the output of the output flip flop 238 back to the inputs (234 and 236) of the mux 232. Of course, in other embodiments, the test logic 130 may operate without a feedback loop and instead may use an output of the pipeline 120 as a direct input to the output flip flop 238 or may use a different source (e.g., a second mux) that is not connected in a feedback loop as the inputs to the mux 232.

Figure 3:
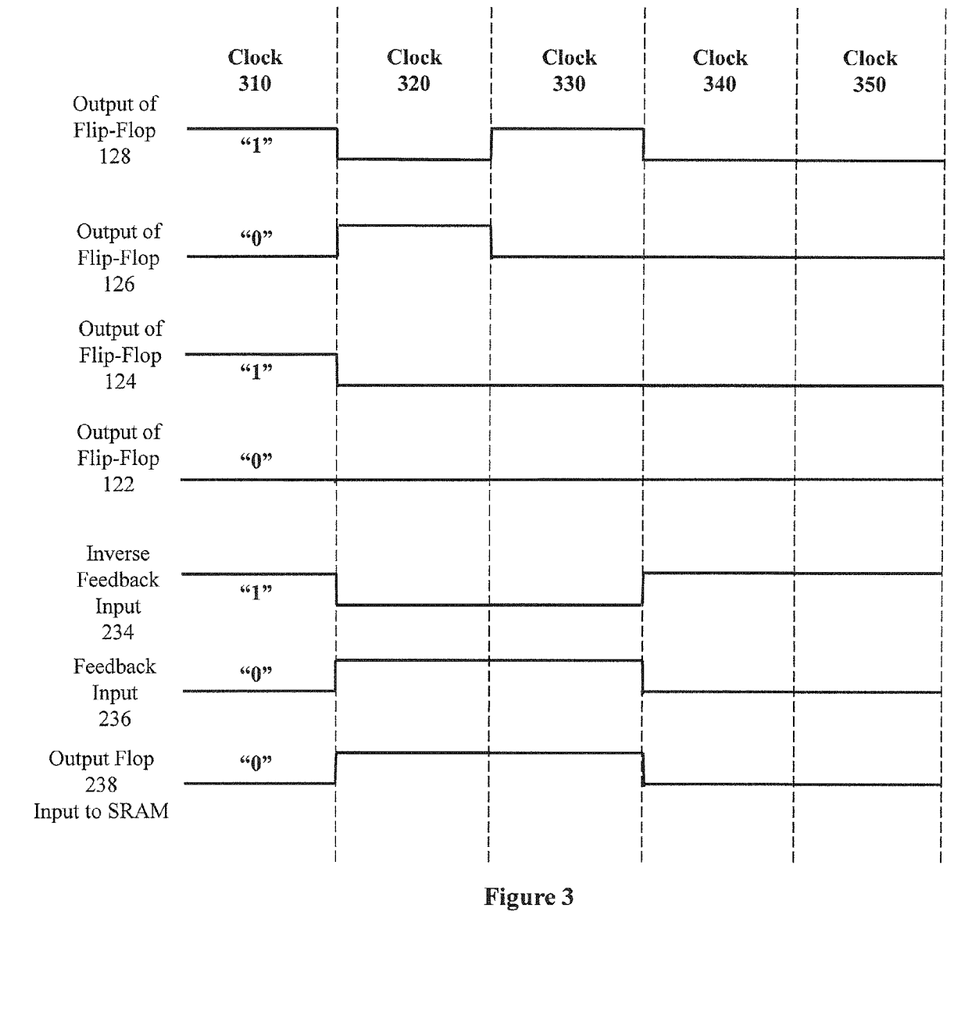
FIG. 3 illustrates an example timing diagram associated with testing of an SRAM.

Further aspects of the apparatus 100 will be discussed in relation to FIG. 3. FIG. 3 illustrates one example of a timing diagram of signals in the apparatus 100. FIG. 3 illustrates five clock cycles in a series of clock cycles from the clock 150. The clock cycles are labeled as 310, 320, 330, 340, and 350. As used in reference to FIG. 3, a clock cycle is a period of an oscillating clock signal (e.g., a square wave) within which the clock signal completes a cycle between a high and a low state. In general, the clock signal is produced by a clock generator (e.g., the clock 150). The clock signal occurs at a clock rate or frequency (e.g., clock speed) at which the SRAM 110 operates when integrated in a computing system (e.g., when embedded with a processor). The clock rate/speed is an operational speed of the SRAM 110 at which the SRAM 110 reads and writes data from and to memory cells in the SRAM 110. While the clock 150 is shown as being separate from the apparatus 100 and the SRAM 110, in one embodiment, the apparatus 100, the clock 150, and the SRAM 110 are embedded in a processor (not shown). Additionally, the apparatus 100 is, for example, connected with an existing scan infrastructure of the processor. The scan infrastructure refers to designed for testing (DFT) elements of the processor that permit scanning in of the control pattern 140 and scanning out of results from a test.

In FIG. 3, values of each flip-flop are denoted by separate timing lines. Initial values of the flip-flops 122-128 are shown at clock cycle 310 as "0101." A value of flip-flop 128 is "1," a value of flip-flop 126 is "0," a value of flip-flop 124 is "1," and a value of flip-flop 122 is "0." Additionally, an initial value of an input to the SRAM 210 is "0," as illustrated at clock 310.

Because the value of flip-flop 128 in the pipeline 120 is "1" the mux 232 is controlled by the pipeline 120 to select the inverse feedback signal 234 as an input to the output flip-flop 238. Accordingly, the mux 232 effectively inverts the current value of the output flip-flop 238 from "0" to "1" as seen at clock 320. Additionally, at clock 320 the value of the flip-flop 128 changes to "0" since values in the pipeline 120 propagate forward one flip-flop at each clock cycle.

Consequently, at clock 320, the flip-flop 128 provides a value of "0" to the mux 232. The mux 232 maintains the current output to the output flip-flop 238 since the control input is a value of "0." To hold the current value, the feedback input signal 236 is selected at clock 320, which has a value of "1." Thus, the input to the SRAM 110 remains "1" at clock 330.

However, since a next value in the pipeline 120 is "1" the input to the SRAM 110 will change to "0" at clock 340. After the input to the SRAM 110 changes at clock 340, the input to the SRAM 110 will not change again since the remaining values in the pipeline 120 are "0." In FIG. 3, after the initial values are loaded into the flip-flops 122-128, zero values are propagated into the pipeline 120 by connecting an input of the flip-flop 122 to a ground. Alternatively, high values can be propagated into the pipeline by connecting the input of the flip-flop 122 to a voltage source. In either case, FIG. 3 illustrates how test inputs to the SRAM 110 can be provided in order to change and test internal memory cells.

In summary, operating the pipeline 120 with the values "0101" when an initial value of the output flip-flop 238 is "0" causes the output flip-flop 238 to toggle to a value of "1" for two clock cycles and then back to "0." This example illustrates how the pipeline 120 can be implemented to vary test input signals to the SRAM 110 over a series of clock cycles without interruption from a testing tool to manually apply values to the SRAM 110 by intermediately loading values after each clock cycle. In effect, a value of "1" in the control pattern causes the current value of the output flip-flop 238 to be changed, and a value of "0" causes the current value of the output flip-flop 238 to be held for a clock cycle. In this way, values for the control pattern can be selected to change or hold the current value of the output flip-flop 238 without regard to the actual value of the output flip-flop 238.

Additionally, FIG. 3 also illustrates how test signals are provided and changed at a core clock speed of the SRAM 110 that is the same as an operational clock speed of the SRAM 110. For example, the core clock speed is the speed at which the SRAM 110 operates when writing and reading data to and from memory cells under normal operating conditions and not a reduced testing speed at which a testing tool operates (e.g., tester 160). The pipeline 120 permits the at-speed testing since the control pattern can be used to automatically control the test logic 130 to dynamically provide a test input at the core speed of the SRAM 110. This is because the control pattern 140 is fed to the test logic 130 according to the clock cycles of the clock 150 and not intermittently by the tester 160. Accordingly, because the control pattern is loaded all at once into the pipeline 120, the control pattern is fed to the test logic 130 at a speed of the clock 150 and not at a speed of the tester 160. Consequently, test input signals are provided to the SRAM 110 (i.e., the unit under test) at the speed of the clock 150 and not at the speed of the tester 160.

Figure 4:
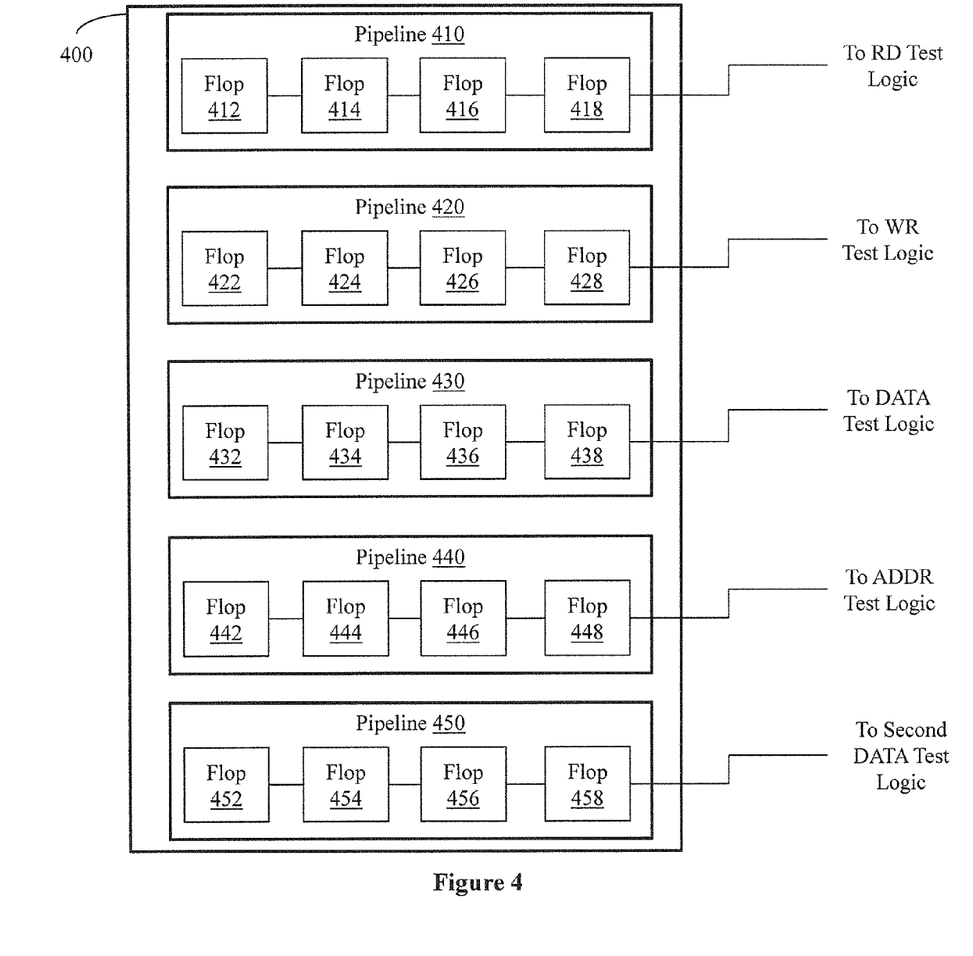
FIG. 4 illustrates one embodiment of a bank of pipelines associated with testing of an SRAM.

Further aspects of testing an SRAM at a core clock speed of the SRAM will be discussed in relation to FIG. 4. FIG. 4 illustrates one example of a bank of pipelines 400. In one embodiment, the bank of pipelines includes five pipelines 410-450 of flip-flops. Each pipeline controls an input of the SRAM to dynamically provide various test inputs to the SRAM (i.e., the unit under test). The pipelines 410-450 are discussed as being connected to individual test logics. However, the pipelines 410-450 can alternatively be directly connected to a respective input of the SRAM without a test logic.

For example, the pipeline 410 is connected to a read (RD) test logic. The pipeline 410 includes flip-flops 412-418 that are programmable with a control pattern of control signals. The RD test logic is, for example, a test logic similar to test logic 130 of FIG. 1. The pipeline 410 controls the RD test logic to provide a test input on a read enable input of the SRAM. When the read enable input is asserted data is read from a specified address in the SRAM. Accordingly, the pipeline 410 controls when data is read from the SRAM by toggling an input to the read enable input of the SRAM.

Similarly, the pipeline 420 is connected to a write (WR) test logic, which provides a test input on a write enable input of the SRAM. When the write enable input is asserted data is written to a specified address in the SRAM. Thus, the pipeline 420 controls when data is written into the SRAM by toggling the write enable input of the SRAM.

The pipeline 430 is connected to a data test logic. The data test logic provides a data input to the SRAM. Accordingly, the pipeline 430 controls the data test logic to provide data to the SRAM. In this way, the pipeline 430 can control which data is written into the SRAM. Additionally, the data input to the SRAM can be fanned out to connect with all data input lines of the SRAM.

The pipeline 440 is connected to the address (ADDR) test logic. The address test logic controls an address line where data is either written to or read from in the SRAM. In another embodiment, a separate pipeline is used for each of a read address and a write address.

In some embodiments, the bank of pipelines 400 includes multiple pipelines for an input to the SRAM when, for example, the input includes multiple lines. For example, the pipeline 450 illustrates a connection to a second data test logic. The pipeline 450 controls a different data input than the pipeline 430 or a portion of data input lines that are not controlled by the pipeline 430. In this way, the pipelines 430 and 450 can provide a greater degree of control over signals provided on the data input.

Additionally, the pipelines 410-450 are each illustrated with four flip-flops. However, the pipelines 410-450 may include more flip-flops or in some implementations fewer flip-flops. Furthermore, the pipelines 410-450 may include a different number of flip-flops from other pipelines. For example, the pipeline 410 may include seven flip-flops while the pipeline 420 includes four flip-flops, and so on. In one embodiment, the bank 400 is connected with an existing scan infrastructure of the SRAM. The scan infrastructure may connect the bank 400 with an external tester (e.g., tester 160) that loads a control pattern into the pipelines 410-450 of bank 400 for performing a test on the SRAM. The bank 400 may also be embedded with the SRAM which is in turn embedded in a high performance high frequency processor.

Figure 5:
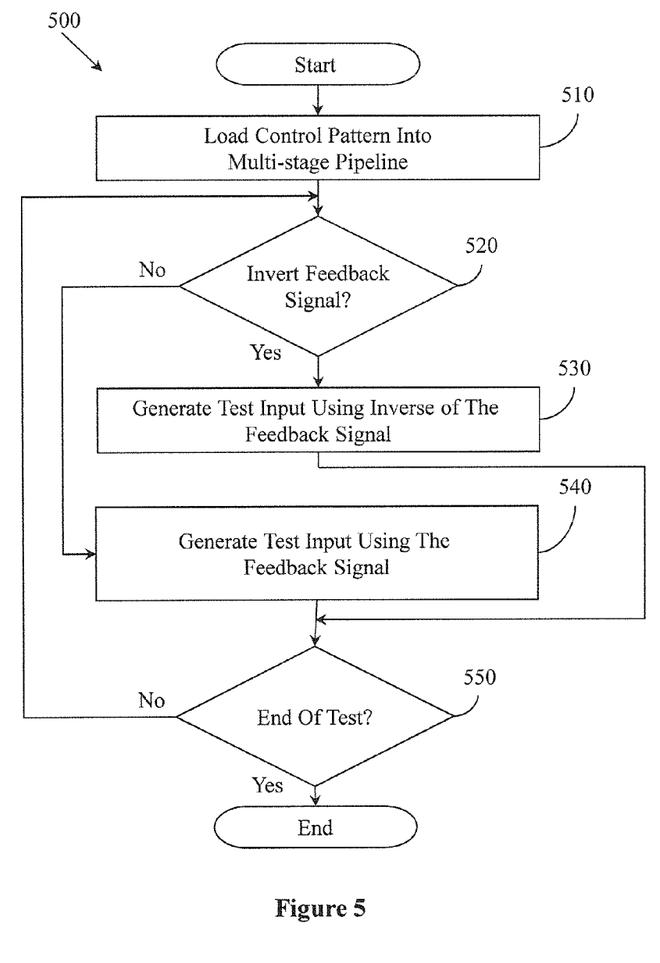
FIG. 5 illustrates one embodiment of a method associated with testing of an SRAM.

Further aspects of testing an SRAM at a core clock speed of the SRAM will be discussed with reference to FIG. 5. FIG. 5 illustrates one embodiment of a method 500 associated with scan based at-speed testing of an SRAM. FIG. 5 will be discussed from the perspective of the apparatus 100 of FIG. 1. At 510, a control pattern is loaded into the pipeline 120. By loading the control pattern 140 into the pipeline 120 prior to beginning a test, test signals can be provided to the SRAM 110 at a core clock speed of the SRAM 110. Additionally, the control pattern 140 can be selected to produce a specific output pattern from the SRAM that tests for, for example, a wide array of defects. In one embodiment, the output pattern is read out using an existing scan infrastructure of the SRAM.

At 520, the apparatus 100 determines whether to invert a feedback signal. The feedback signal is a current input to the SRAM 110 that is provided through a feedback loop as an input to the apparatus 100. The feedback signal can either be provided without modification to the SRAM 110 as the test input signal or the feedback signal can be inverted prior to being provided to the SRAM 110 as the test input signal. If a current control signal in the control pattern 140 indicates to invert the feedback signal, then the method 500 proceeds to 530. If the control pattern 140 indicates that the feedback signal is not to be inverted, then the method 500 proceeds to 540.

At 530, the apparatus 100 generates a test signal on a test input of the SRAM 110 by inverting the feedback signal. In this way, the control pattern from the pipeline 120 controls test input signals provided to the SRAM 110 at a speed of the clock 150 and without waiting for the tester 160 to load an intermediate value.

At 540, the apparatus 100 generates a test input signal on a test input of the SRAM 110 by using the feedback signal without modifying the feedback signal. After generating the test input signal at either 530 or 540 the method proceeds to 550.

At 550, the apparatus 100 determines whether the control pattern in the pipeline 120 has been exhausted. If the control pattern has not been exhausted then the apparatus 100 proceeds to a next clock cycle by repeating the method 500 from 520 and without waiting for the tester 160 to load an intermediate value.

In another embodiment, the described methods and/or their equivalents may be implemented with computer executable instructions. Thus, in one embodiment, a non-transitory computer-readable medium is configured with stored computer executable instructions that when executed by a machine (e.g., processor, computer, and so on) cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
RAM: random access memory.
SRAM: Static RAM.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes a computer or electrical hardware component(s), firmware, a non-transitory computer readable medium that stores instructions, and/or combinations of these components configured to perform a function(s)

or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic unit/component. Similarly, where a single logic unit is described, it may be possible to distribute that single logic unit between multiple physical logic units/components.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. A method, comprising:
    loading, into a multi-stage pipeline of storage devices, a control pattern;
    generating a test input that is based, at least in part, on the control pattern from the multi-stage pipeline of storage devices; and
    testing a static random access memory (SRAM) by providing the test input to the SRAM over a series of clock cycles that are at a core clock speed of the SRAM.

2. The method of claim 1, wherein generating the test input includes controlling a test logic to toggle a feedback signal of a previous test input, and wherein for each of the series of clock cycles the control pattern indicates whether to provide the feedback signal as the test input or to provide an inverse of the feedback signal as the test input.

3. The method of claim 1, wherein the multi-stage pipeline controls the test input by using the control pattern to generate the test input.

4. The method of claim 1, further comprising generating the series of clock cycles at the core clock speed that is an operational clock speed of the SRAM, and wherein the testing occurs at the core clock speed.

5. The method of claim 1, wherein providing the test input to the SRAM includes dynamically toggling inputs to the SRAM over the series of clock cycles.

6. The method of claim 5, wherein toggling the inputs to the SRAM includes changing the inputs to the SRAM to cause the SRAM to write values into memory cells in the SRAM and to read the values from the memory cells.

7. The method of claim 1, wherein the control pattern from the multi-stage pipeline of storage devices stores at least four stages of signals for generating at least four test inputs over at least four clock cycles.

8. The method of claim 1, wherein generating the test input that is based, at least in part, on the control pattern from the multi-stage pipeline of storage devices includes the multi-stage pipeline controlling the generating over a series of clock cycles by providing a signal from the control pattern on each clock cycle of the series of clock cycles.

9. The method of claim 1, wherein testing the SRAM includes automatically generating the test input at an operational clock speed of the SRAM, wherein the series of clock cycles are oscillating signals that occur at a rate at which the SRAM operates.

10. An apparatus, comprising:
    a plurality of memory cells for storing data;
    a test logic configured to generate a sequence of test signals as a test input to the plurality of memory cells; and
    a bank of flip-flops configured to sequentially provide a series of control signals to the test logic, wherein the series of control signals are configured to toggle the test input to the plurality of memory cells across multiple clock cycles, wherein the clock cycles occur at an operational speed of a static random access memory (SRAM) connected to the apparatus, and wherein the series of control signals include a control signal for each clock cycle.

11. The apparatus of claim 10, wherein the bank of flip-flops is configured to sequentially provide the series of control signals to the test logic to automatically generate the test input at the operational speed of the SRAM.

12. The apparatus of claim 10, wherein the series of control signals are configured to toggle the test signals to cause the SRAM to change one or more internal states of the plurality of memory cells over the multiple clock cycles.

13. The apparatus of claim 10, wherein the test logic is configured to provide the test input to the SRAM by dynamically toggling inputs to the SRAM over the multiple clock cycles.

14. The apparatus of claim 10, wherein the bank of flip-flops is configured to sequentially provide at least four control signals.

15. The apparatus of claim 10, wherein the bank of flip-flops permits built in self-testing of the SRAM with the series of control signals that are pre-computed.

16. An integrated circuit, comprising:
    a pipeline that includes a plurality of flip-flops arranged sequentially, wherein the plurality of flip-flops store a control pattern that includes a series of control signals;
    a test logic configured to generate a series of test signals as a function of the series of control signals, wherein the pipeline is connected to a control input of the test logic, and wherein an output of the test logic is connected to a static random access memory (SRAM); and a feedback loop between the output of the test logic and an input of the test logic that recirculates a current test signal of the series of test signals to the input of the test logic, wherein the test logic is configured to generate the series of test signals by selecting between the current test signal and an inverse of the current test signal as a function of the series of control signals.

17. The integrated circuit of claim 16, wherein the test logic generates the series of test signals over a series of clock cycles that occur at a core clock speed of the SRAM.

18. The integrated circuit of claim 16, wherein the test logic is configured to generate the series of test signals by dynamically toggling inputs to the SRAM over a series of clock cycles.

19. The integrated circuit of claim 16, wherein the test logic is configured to generate the series of test signals based on the series of control signals to change one or more internal states of memory cells in the SRAM over a series of clock cycles.

20. The integrated circuit of claim 16, wherein the pipeline is configured to sequentially provide the series of control signals to the test logic to automatically generate the test input at an operational clock speed of the SRAM.

* * * * *